United States Patent
Orita

(10) Patent No.: US 10,036,674 B2
(45) Date of Patent: Jul. 31, 2018

(54) CAPACITANCE MEASURING DEVICE AND CAPACITANCE MEASUREMENT METHOD FOR DIELECTRIC ELASTOMER

(71) Applicant: HONDA MOTOR CO., LTD., Tokyo (JP)

(72) Inventor: Atsuo Orita, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 240 days.

(21) Appl. No.: 15/075,869

(22) Filed: Mar. 21, 2016

(65) Prior Publication Data

US 2017/0268939 A1  Sep. 21, 2017

(51) Int. Cl.
*G01L 1/14* (2006.01)

(52) U.S. Cl.
CPC .................... *G01L 1/142* (2013.01)

(58) Field of Classification Search
CPC .................... H02N 2/062; H01L 41/042
See application file for complete search history.

(56) References Cited

U.S. PATENT DOCUMENTS

| | | | | |
|---|---|---|---|---|
| 4,160,139 A * | 7/1979 | Johnston | ............. | H01H 35/346 200/83 N |
| 5,378,864 A * | 1/1995 | Olivier | ............. | H01H 3/00 137/68.29 |
| 6,043,665 A * | 3/2000 | Nishioka | ............. | G01R 27/28 324/548 |
| 6,376,971 B1 * | 4/2002 | Pelrine | ............. | F04B 35/00 310/363 |
| 6,768,246 B2 * | 7/2004 | Pelrine | ............. | F02G 1/043 310/317 |
| 6,809,462 B2 * | 10/2004 | Pelrine | ............. | A63H 3/365 310/319 |
| 6,882,086 B2 * | 4/2005 | Kornbluh | ............. | B60G 17/01941 310/328 |
| 6,910,385 B2 * | 6/2005 | Shkel | ............. | G01L 1/005 73/780 |
| 7,064,472 B2 * | 6/2006 | Pelrine | ............. | A61M 5/142 310/324 |
| 7,233,097 B2 * | 6/2007 | Rosenthal | ............. | A61M 5/142 310/328 |

(Continued)

FOREIGN PATENT DOCUMENTS

JP  2003-174205  6/2003

*Primary Examiner* — Harshad R Patel
*Assistant Examiner* — Tran M Tran
(74) *Attorney, Agent, or Firm* — Rankin, Hill & Clark LLP

(57) ABSTRACT

A device capable of measuring the capacitance of a dielectric elastomer by variably manipulating the voltage applied to the dielectric elastomer includes a capacitance estimating unit that acquires current detection values at a plurality of sampling times in a current reduction period in which, when an output voltage of a power source changes, an energizing current of a dielectric elastomer increases and then gradually decreases according to the change in the output voltage, and estimates the capacitance of the dielectric elastomer on the basis of a model representing a correlation between the time-dependent change of the energizing current and the capacitance of the dielectric elastomer in the current reduction period, and the current detection values.

8 Claims, 4 Drawing Sheets

(56) References Cited

U.S. PATENT DOCUMENTS

| | | | | |
|---|---|---|---|---|
| 7,287,429 B2* | 10/2007 | Umemura | G01P 15/125 | 73/514.32 |
| 7,288,877 B2* | 10/2007 | Kita | B25J 7/00 | 310/359 |
| 7,320,457 B2* | 1/2008 | Heim | F04B 35/045 | 239/601 |
| 7,362,032 B2* | 4/2008 | Pelrine | A61M 5/142 | 310/309 |
| 7,432,724 B2* | 10/2008 | Goto | G01R 27/2605 | 324/658 |
| 7,482,734 B2* | 1/2009 | Takeuchi | H01L 41/0946 | 310/331 |
| 7,537,197 B2* | 5/2009 | Heim | F16K 99/0001 | 239/601 |
| 7,565,071 B2* | 7/2009 | Lin | G03B 7/097 | 348/362 |
| 7,595,580 B2* | 9/2009 | Heim | F04B 43/0054 | 310/324 |
| 7,642,913 B2* | 1/2010 | Hayakawa | G01L 15/08 | 324/661 |
| 7,703,742 B2* | 4/2010 | Heim | F16K 99/0001 | 239/597 |
| 7,732,999 B2* | 6/2010 | Clausen | H01L 41/083 | 310/328 |
| 7,761,981 B2* | 7/2010 | Rosenthal | A61M 5/142 | 29/825 |
| 7,834,527 B2* | 11/2010 | Alvarez Icaza Rivera | H01L 41/0478 | 310/344 |
| 7,915,792 B2* | 3/2011 | Takeuchi | H01L 41/0836 | 310/328 |
| 7,971,850 B2* | 7/2011 | Heim | F16K 99/0001 | 239/597 |
| 8,022,599 B2* | 9/2011 | Kawakubo | B81B 3/0008 | 310/307 |
| 8,042,264 B2* | 10/2011 | Rosenthal | A61M 5/142 | 29/25.03 |
| 8,093,783 B2* | 1/2012 | Rosenthal | A61M 5/142 | 310/328 |
| 8,183,739 B2* | 5/2012 | Heim | F04B 43/0054 | 310/322 |
| 8,188,636 B2* | 5/2012 | Baird | H02K 99/10 | 310/319 |
| 8,316,526 B2* | 11/2012 | Pei | H01L 41/0536 | 29/592.1 |
| 8,406,438 B2* | 3/2013 | Ihl | F16F 15/005 | 181/209 |
| 8,517,963 B2* | 8/2013 | Larson | A61B 17/1325 | 600/16 |
| 8,547,039 B2* | 10/2013 | Ikushima | F03G 7/005 | 310/308 |
| 8,947,099 B2* | 2/2015 | Gao | F03G 7/065 | 324/522 |
| 9,016,133 B2* | 4/2015 | Besling | H01H 35/346 | 200/83 N |
| 9,027,408 B2* | 5/2015 | Toth | G01L 1/205 | 338/22 R |
| 9,170,288 B2* | 10/2015 | O'Brien | H01L 41/042 | |
| 9,183,710 B2* | 11/2015 | Zellers | G08B 6/00 | |
| 9,761,790 B2* | 9/2017 | Yoo | B32B 37/12 | |
| 9,797,759 B2* | 10/2017 | Lozano | G01F 15/14 | |
| 2012/0299514 A1* | 11/2012 | Anderson | H01L 41/107 | 318/116 |
| 2013/0021087 A1* | 1/2013 | Rosset | G05G 9/047 | 327/509 |
| 2013/0100575 A1* | 4/2013 | O'Brien | H02N 2/181 | 361/283.1 |
| 2014/0054438 A1* | 2/2014 | Yun | G06F 1/1652 | 248/550 |
| 2015/0034237 A1* | 2/2015 | Biggs | H01L 41/047 | 156/234 |
| 2015/0123647 A1* | 5/2015 | Gisby | H01L 41/042 | 324/76.11 |
| 2015/0200039 A1* | 7/2015 | Taguchi | C08L 21/00 | 310/363 |
| 2016/0260888 A1* | 9/2016 | Alexander | H01L 41/0475 | |
| 2016/0348774 A1* | 12/2016 | Orita | F16H 25/20 | |
| 2017/0010130 A1* | 1/2017 | Xu | G01L 1/142 | |

\* cited by examiner

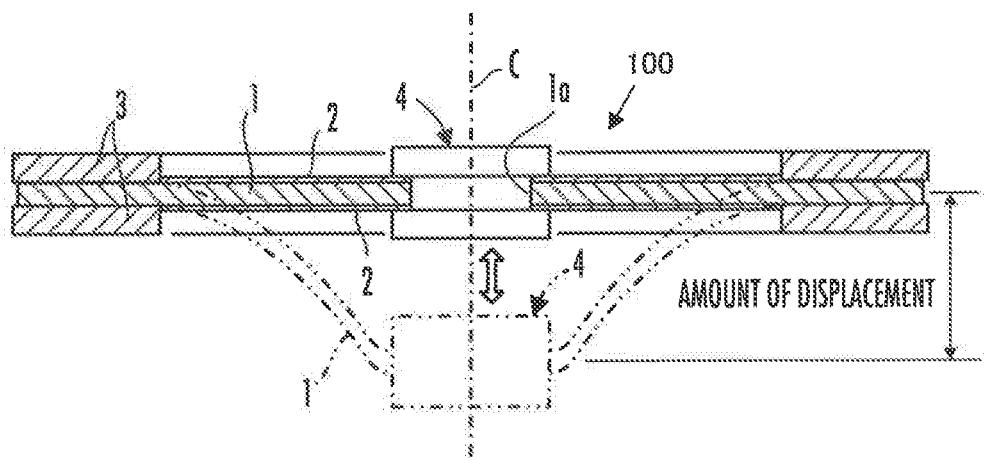
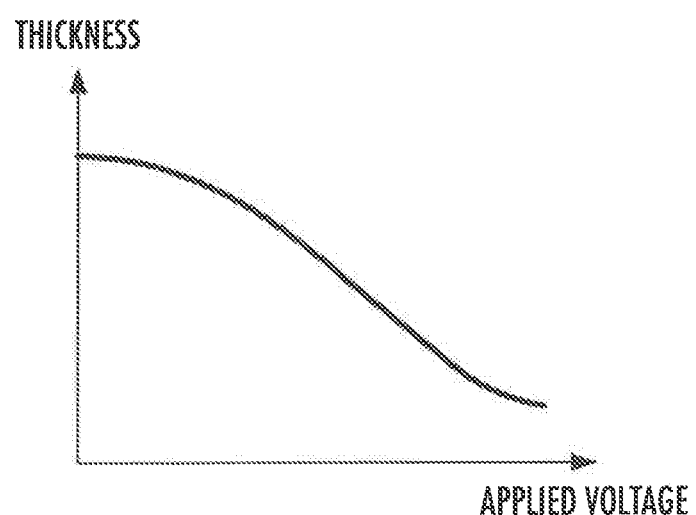

CAPACITANCE MEASURING DEVICE AND CAPACITANCE MEASUREMENT METHOD FOR DIELECTRIC ELASTOMER

BACKGROUND OF THE INVENTION

Field of the Invention

The present invention relates to a device and a method for measuring the capacitance of a dielectric elastomer, which elastically deforms according to an applied voltage.

Description of the Related Art

A dielectric elastomer has the property that, when a voltage is applied thereto, the dielectric elastomer is compressed by Maxwell stresses in the direction of an electric field attributable to the applied voltage. Further, the stiffness or the like of the dielectric elastomer can be controlled to a required target state by variably manipulating the voltage applied to the dielectric elastomer (hereinafter may be referred to simply as "the elastomer"). For this reason, the elastomer has been used in a variety of technical fields in recent years (refer to, for example, Japanese Patent Application Laid-Open No. 2003-174205).

In the case where the voltage applied to an elastomer is variably manipulated in order to control the stiffness or the like of the elastomer to a required target state, it is frequently desired that a state amount closely related to an actual elastic deformation state of the elastomer can be acquired in order to properly perform the control.

In this case, for example, the amount of the elastic deformation of the elastomer may be directly measured using a displacement sensor, such as a distance sensor or the like. However, the displacement sensor must be placed in the vicinity of the elastomer, frequently leading to structural restrictions thereto. Further, the elastomer is flexible and may develop shape deformation in response to an external force, making it generally difficult to measure the amount of the elastic deformation of the elastomer with high reliability by using a displacement sensor.

Meanwhile, the elastomer is an electrical insulator and therefore functions as a capacitive element. The capacitance of the elastomer as a capacitive element has a high correlation with the thickness (the thickness in the direction in which an electric field acts) or the shape dimensional values, such as area, of the elastomer. Further, the capacitance of the elastomer can be estimated from a detected electrical value, such as a current value or the like, so that a system for measuring the capacitance has minimal structural restrictions.

Hence, the capacitance of the elastomer may be measured as the state amount closely related to the actual elastic deformation state of the elastomer. In this case, it is desired that the capacitance of the elastomer can be measured with high reliability while allowing the voltage applied to the elastomer to be variably manipulated.

SUMMARY OF THE INVENTION

The present invention has been made in view of the background described above, and an object of the invention is to provide a device and a method that make it possible to properly measure the capacitance of a dielectric elastomer by variably manipulating a voltage applied to the dielectric elastomer.

A capacitance measuring device for a dielectric elastomer in accordance with the present invention is a device adapted to measure a capacitance of a dielectric elastomer, which elastically deforms according to an applied voltage, the device including:

a power source which outputs a voltage applied to the dielectric elastomer such that the voltage can be variably controlled;

a current detector which detects an energizing current of the dielectric elastomer; and a capacitance estimating unit which estimates a capacitance of the dielectric elastomer by using a detection value of the energizing current detected by the current detector, wherein the capacitance estimating unit is configured to carry out:

energizing current sampling for acquiring, in a case where a voltage output from the power source is changed, detection values of the energizing current at a plurality of sampling times in a current reduction period, in which the energizing current of the dielectric elastomer increases and then decreases according to the change of the voltage, and capacitance estimation processing for determining an estimated value of the capacitance of the dielectric elastomer based on a model, which represents a correlation between a time-dependent change of the energizing current of the dielectric elastomer and the capacitance of the dielectric elastomer in the current reduction period, and the detection values of the energizing current at the plurality of the sampling times (a first aspect of the invention).

In the following description of the present invention, the dielectric elastomer may be referred to simply as the elastomer.

It is now assumed that the voltage output from the power source (the voltage applied to the elastomer) is changed relatively suddenly (e.g. in steps). In this case, a transient response phenomenon causes the energizing current of the elastomer to suddenly increases and then gradually decreases. At this time, during the period in which the energizing current gradually decreases (the current reduction period), the energizing current gradually decreases at a time constant specified on the basis of the value of the capacitance of the elastomer and the resistance value of the current path of the energizing current (the resistance value of a resistance element that can be regarded to be connected in series with the elastomer).

Therefore, the time-dependent change of the actual energizing current of the elastomer in the current reduction period has a high correlation with the capacitance of the elastomer.

Hence, according to the first aspect of the invention, the capacitance estimating unit carries out the energizing current sampling in the current reduction period based on the transient response phenomenon. Thus, the detection values of the energizing current of the elastomer at the plurality of sampling times in the current reduction period are acquired.

Then, the capacitance estimating unit determines an estimated value of the capacitance of the elastomer by the capacitance estimation processing on the basis of the model and the detection values of the energizing current at the plurality of sampling times in the current reduction period.

In this case, the time series of the detection values of the energizing current of the elastomer at the plurality of sampling times has a high correlation with the capacitance of the elastomer, so that the estimated value of the capacitance of the elastomer can be properly determined by the capacitance estimation processing.

Thus, the first aspect of the invention makes it possible to properly measure the capacitance of the elastomer by variably manipulating the voltage applied to the elastomer.

In the first aspect of the invention described above, preferably, the capacitance measuring device further includes a power source control unit which controls an output of the power source such that the voltage output from the power source becomes a vibration component superimposed voltage, which is a voltage obtained by superimposing a vibration component of a predetermined frequency over a steady desired value of the applied voltage of the dielectric elastomer, wherein the capacitance estimating unit is configured to sequentially carry out, at a predetermined estimation processing cycle synchronized with the vibration component, the estimation of the capacitance of the dielectric elastomer by the energizing current sampling and the capacitance estimation processing in a state in which the applied voltage is being controlled to the vibration component superimposed voltage (a second aspect of the invention).

The steady desired value means the voltage to be applied to the elastomer in order to steadily maintain the state, such as stiffness or the like, of the elastomer at a desired state (i.e. the applied voltage corresponding to the desired state of the elastomer).

The second aspect of the invention described above makes it possible to change the output voltage of the power source by the vibration component superimposed over the steady desired value even in the case where the steady desired value, which is the basic value of the applied voltage of the elastomer, is continuously maintained to be constant. This allows the transient response phenomenon to happen, thus permitting the measurement of the capacitance of the elastomer by the processing carried out by the capacitance estimating unit.

Further, in this case, the voltage value of the vibration component periodically changes, so that the capacitance of the elastomer can be sequentially measured (estimated) on a periodic basis.

In addition, the amplitude of the vibration component is set to a level that exerts less influence on the state, such as stiffness or the like, of the elastomer, so that the capacitance of the elastomer can be measured while mostly maintaining the state of the elastomer at the state corresponding to the steady desired value.

In the second aspect of the invention described above, the vibration component is preferably a square-wave signal (a third aspect of the invention).

With this arrangement, the output voltage of the power source can be changed in steps by the vibration component, thus allowing the transient response phenomenon, which has a high correlation with the capacitance of the elastomer, to markedly happen. This makes it possible to properly estimate the capacitance of the elastomer with high reliability by the processing carried out by the capacitance estimating unit.

In the second aspect aspect of the invention described above, the dielectric elastomer may be configured such that an external force that causes the elastic deformation thereof can be variably applied.

In this case, the capacitance of the elastomer may change due to the influence of a change in the external force. Therefore, to cope with such a case, preferably, the capacitance estimating unit is configured to further include a function for carrying out first processing for sequentially acquiring a first current detection value, which is a detection value of the energizing current immediately before a voltage value of the vibration component changes, in a state in which the voltage output from the power source is being controlled to the vibration component superimposed voltage, and second processing for predicting, based on a plurality of past values of the first current detection value acquired in the first processing, a time-dependent change pattern of the energizing current in the period of each estimation processing cycle, which is a time-dependent change pattern of the energizing current in a case where it is assumed that the voltage value of the vibration component in the period of the estimation processing cycle is continuously maintained at a voltage value immediately before a start of the period of the estimation processing cycle, before the period of the estimation processing cycle is started, and to correct, by the capacitance estimation processing at each estimation processing cycle, each of the detection values of the energizing current at the plurality of the sampling times during the current reduction period in the period of the estimation processing cycle by a current value at each sampling time specified by the time-dependent change pattern predicted by the second processing for the estimation processing cycle thereby to determine an estimated value of the capacitance of the dielectric elastomer based on a current value after the correction and the model (a fourth aspect of the invention).

With this arrangement, the time-dependent change pattern of the energizing current attributable to a change in the capacitance of the elastomer based on a change in the external force applied to the elastomer can be predicted by the first processing and the second processing. Thus, the components of the energizing current attributable to a change in the capacitance of the elastomer based on a change in the external force can be removed from the detection values of the energizing current at the plurality of sampling times by correcting each of the detection values of the energizing current at the plurality of sampling times in the current reduction period in the period of each estimation processing cycle by the current value at each sampling time specified by the time-dependent change pattern predicted in the second processing.

As a result, even in a situation wherein the external force changes, the capacitance of the elastomer can be estimated with high reliability by determining the estimated value of the capacitance of the elastomer on the basis of the corrected current values and the model.

In the first aspect of the invention described above, the dielectric elastomer may be formed like a sheet and may be configured such that the applied voltage can be imparted in a thickness direction thereof and that the dielectric elastomer elastically deforms to increase or decrease the thickness by changing the applied voltage (a fifth aspect of the invention).

With this arrangement, the capacitance of the sheet-like elastomer can be measured (estimated).

In the fifth aspect of the invention described above, more specifically, the dielectric elastomer has a middle portion thereof fixed to a first member and a peripheral portion thereof fixed to a second member which is relatively movable in the thickness direction of the dielectric elastomer with respect to the first member, and is provided in a tensioned state such that the dielectric elastomer is subjected to a tension between the first member and the second member in a state in which the applied voltage is not being imparted (a sixth aspect of the invention).

With this arrangement, the stiffness of the elastomer between the first member and the second member can be changed by changing the applied voltage.

Further, a capacitance measurement method for a dielectric elastomer in accordance with the present invention is a method for measuring the capacitance of a dielectric elastomer that elastically deforms according to an applied voltage, the method including:

a first step of changing a voltage applied to the dielectric elastomer;

a second step of acquiring detection values of an energizing current of the dielectric elastomer at a plurality of sampling times in a current reduction period, in which the energizing current increases and then decreases according to processing of the first step; and a third step of determining an estimated value of the capacitance of the dielectric elastomer from a model, which represents a correlation between a time-dependent change of the energizing current of the dielectric elastomer and the capacitance of the dielectric elastomer in the current reduction period, and the detection values of the energizing current at the plurality of the sampling times (a seventh aspect of the invention).

As with the first aspect of the invention, the seventh aspect of the invention described above makes it possible to properly measure the capacitance of the elastomer by variably manipulating the voltage applied to the elastomer.

In the seventh aspect of the invention described above, preferably, the first step includes a step of controlling the voltage applied to the dielectric elastomer to a vibration component superimposed voltage, which is a voltage obtained by superimposing a vibration component of a predetermined frequency over a steady desired value of the applied voltage, thereby to periodically change the applied voltage by the vibration component, and the processing in the second step and the third step is processing sequentially carried out at a predetermined estimation processing cycle synchronized with the vibration component in a state in which the applied voltage is being controlled to the vibration component superimposed voltage (an eighth aspect of the invention).

With this arrangement, the same effect as that of the foregoing second aspect of the invention can be obtained.

In the eighth aspect of the invention described above, the vibration component is preferably a square-wave signal (a ninth aspect of the invention).

With this arrangement, the same effect as that of the foregoing third aspect of the invention can be obtained.

In the eighth aspect or the ninth aspect of the invention described above, in the case where the dielectric elastomer is provided such that an external force causing the dielectric elastomer to elastically deform can be variably applied thereto, preferably, the method further includes a fourth step of sequentially acquiring a first current detection value, which is a detection value of the energizing current immediately before a voltage value of the vibration component changes, in a state in which the applied voltage is being controlled to the vibration component superimposed voltage, and a fifth step of predicting, based on a plurality of past values of the first current detection value acquired in the fourth step, a time-dependent change pattern of the energizing current in the period of each estimation processing cycle, which is a time-dependent change pattern of the energizing current in a case where it is assumed that the voltage value of the vibration component in the period of the estimation processing cycle is continuously maintained at a voltage value immediately before a start of the period of the estimation processing cycle, before the period of the estimation processing cycle is started, and the processing in the third step in each estimation processing cycle corrects each of the detection values of the energizing current at the plurality of the sampling times during the current reduction period in the period of the estimation processing cycle by using a current value at each sampling time specified by the time-dependent change pattern predicted in the fifth step for the estimation processing cycle, thereby determining an estimated value of the capacitance of the dielectric elastomer based on a current value after the correction and the model (a tenth aspect of the invention).

With this arrangement, the same effect as that of the foregoing fourth aspect of the invention can be obtained.

BRIEF DESCRIPTION OF THE DRAWINGS

FIG. 1 is a diagram illustrating a variable stiffness mechanism provided with a dielectric elastomer according to an embodiment of the present invention;

FIG. 2 is a graph illustrating the relationship between an applied voltage and a thickness of the dielectric elastomer;

DESCRIPTION OF THE PREFERRED EMBODIMENTS

Figure 3:
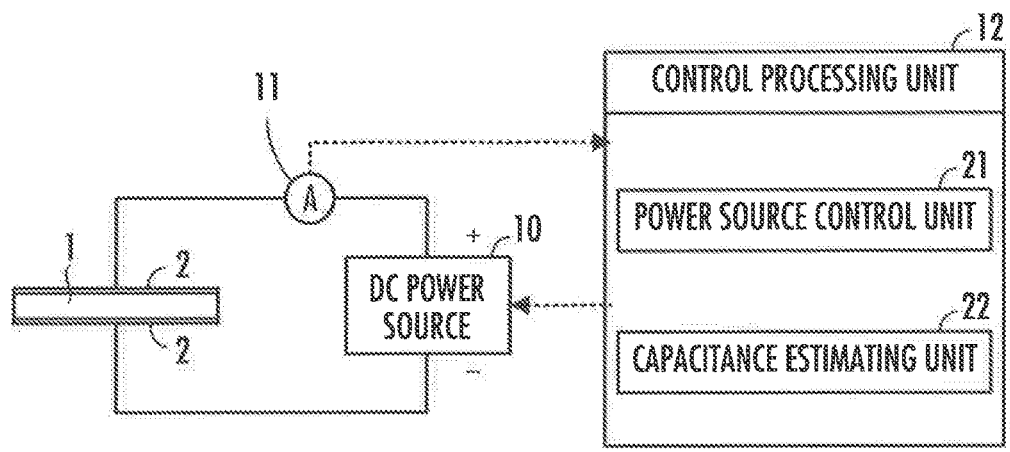
FIG. 3 is a general configuration diagram of a system having a function that measures the capacitance of the dielectric elastomer.

An embodiment of the present invention will be described below with reference to FIG. 1 to FIG. 7C. Referring to FIG. 1, a dielectric elastomer 1 in the present embodiment is formed like a sheet. The dielectric elastomer 1 (hereinafter referred to simply as the elastomer 1) can be composed of, for example a silicone resin, a urethane resin, or an acrylic resin. Further, film-like electrodes 2, 2 are firmly fixed to both surfaces in the direction of the thickness of the elastomer 1, covering each of the surfaces.

The elastomer 1 illustrated in FIG. 1 is incorporated in a variable stiffness mechanism 100 as, for example, a constituent element of the variable stiffness mechanism 100.

In the variable stiffness mechanism 100, frame members 3 are firmly fixed to the peripheral part of the elastomer 1 such that the frame members 3 sandwich the elastomer 1. In this case, the peripheral part of the elastomer 1 is retained by the frame members 3 in a state in which the elastomer 1 is pulled in the direction along the surfaces (a state in which a pre-tension is being imparted).

Further, a hole 1a is drilled in the central part of the elastomer 1. A movable member 4, which can be relatively moved with respect to the frame members 3, is attached to the hole 1a. The movable member 4 is guided and moved in the direction of a central axis C of the elastomer 1 by a guide mechanism (not illustrated).

The frame members 3 and the movable member 4 correspond to the second member and the first member, respectively, in the present invention.

In the variable stiffness mechanism 100 having the foregoing configuration, the movable member 4 is displaced in the direction of the central axis C with respect to the frame members 3 to cause the elastomer 1 to warp, as indicated by the two-dot chain line in FIG. 1, and to generate an elastic force in a direction of returning the movable member 4 to its original equilibrium position (the position in a non-load state in which no external force that causes the movable member 4 to be relatively displaced with respect to the frame members 3 is being applied).

Further, a voltage is applied to the elastomer 1 through the electrodes 2, 2 (an electric field is generated in the direction of the thickness of the elastomer 1 between the electrodes 2, 2) thereby to compress the elastomer 1 in the thickness direction by the Maxwell stresses. Accordingly, the elastomer 1 is elongated in the direction along the surfaces (the area observed in the thickness direction increases) in the state wherein no external force is being applied (a natural length state).

Hence, in the variable stiffness mechanism 100, wherein the peripheral part of the elastomer 1 is retained by the frame members 3, the tension (pre-tension) of the elastomer 1 between the movable member 4 and the frame members 3 decreases, and the stiffness of the elastomer 1 (the stiffness when the movable member 4 is relatively displaced in the direction of the central axis C with respect to the frame members 3) also decreases.

In this case, the thickness of the elastomer 1 decreases as the applied voltage increases, as illustrated in FIG. 2. Therefore, the stiffness of the elastomer 1 decreases as the applied voltage increases.

Thus, in the variable stiffness mechanism 100, the stiffness of the elastomer 1 between the movable member 4 and the frame members 3 can be variably adjusted by manipulating the voltage applied to the elastomer 1.

Supplementarily, the variable stiffness mechanism 100 may have a structure of a plurality of the elastomers 1 stacked between the frame members 3 and the movable member 4.

Meanwhile, the elastomer 1 is an electrical insulator and therefore has a function as a capacitive element (has a capacitance). In this case, basically, the capacitance of the sheet-like elastomer 1 is proportional to the area of the elastomer 1 (the area observed in the thickness direction) and inversely proportional to the thickness of the elastomer 1. Further, the relationship between the thickness and the area of the elastomer 1 in the state wherein no external force is being applied (the natural length state) is basically an inversely proportional relationship. Therefore, the capacitance of the elastomer 1 is basically inversely proportional to the square of the thickness of the elastomer 1.

FIG. 3 illustrates the general configuration of a system that has a function for measuring (estimating) the capacitance of the elastomer 1 in the present embodiment. This system is capable of measuring the capacitance of the elastomer 1 while concurrently variably controlling the stiffness of the elastomer 1 by manipulating the voltage applied to the elastomer 1. The system, therefore, functions as the capacitance measuring device in the present invention.

In the system of the present embodiment, the measurement value (or the estimated value) of the capacitance of the elastomer 1 is used to estimate, for example, the amount of displacement (the amount of displacement in the direction of the central axis C) of the movable member 4. In other words, the amount of displacement indicates the amount of the elastic deformation of the elastomer 1.

The system illustrated in FIG. 3 includes a DC power source 10 (corresponding to a power source in the present invention) connected to the electrodes 2, 2 of the elastomer 1, a current detector 11 which detects the energizing current flowing between the DC power source 10 and the elastomer 1, and a control processing unit 12.

The DC power source 10 is a power source that outputs a DC voltage between the electrodes 2, 2 of the elastomer 1, and is configured such that the magnitude of the output voltage can be variably controlled to a required desired value. The DC power source 10 has an overcurrent prevention function that prevents the passage of an excessive current. If a current flowing through the DC power source 10 (an output current or an input current) exceeds a predetermined upper limit value (limit value), then the current will be forcibly limited to the upper limit value.

The control processing unit 12 is composed of one or a plurality of electronic circuit units, which include a CPU, a RAM, a ROM, an interface circuit and the like. The control processing unit 12 includes a power source control unit 21, which controls the output voltage of the DC power source 10, and a capacitance estimating unit 22, which estimates the capacitance of the elastomer 1, as the functions implemented by a hardware configuration or a program, which is installed therein.

The following will describe in detail the processing carried out by the power source control unit 21 and the capacitance estimating unit 22.

The power source control unit 21 sequentially determines the steady desired value of the output voltage of the DC power source 10 (the voltage applied to the elastomer 1) on the basis of the desired value of the degree of stiffness of the elastomer 1 in the variable stiffness mechanism 100. Then, the power source control unit 21 controls the DC power source 10 such that a voltage obtained by superimposing a vibration component of a predetermined frequency over the steady desired value (hereinafter referred to as the vibration component superimposed voltage) is output from the DC power source 10.

The desired value of the degree of stiffness of the elastomer 1 is appropriately determined by the control processing unit 12 according to an operation request or the like of an arbitrary device (e.g. a joint mechanism of a robot) on which the variable stiffness mechanism 100 is mounted, or a desired value appropriately given to the control processing unit 12 from an external other device.

The desired value of the degree of stiffness may be, for example, the desired value of the sensitivity of a change in the elastic force of the elastomer 1 with respect to a change in the amount of displacement of the movable member 4, i.e. a translational elastic force that moves the movable member 4 in the direction of the central axis C, (a sensitivity corresponding to a so-called spring constant), or the desired value of a reciprocal value of the sensitivity.

Further, the steady desired value in the present embodiment is a desired voltage value having a relationship with a desired value of the degree of stiffness of the elastomer 1 determined in advance, the desired voltage value being used as a reference desired value of the voltage to be applied to the elastomer 1 in a steady state, in which the degree of stiffness of the elastomer 1 is maintained at a fixed desired value.

The steady desired value is determined according to, for example, an arithmetic expression or a data table or the like prepared in advance on the basis of experiments or the like from a desired value of the degree of stiffness of the elastomer 1.

Figure 4:
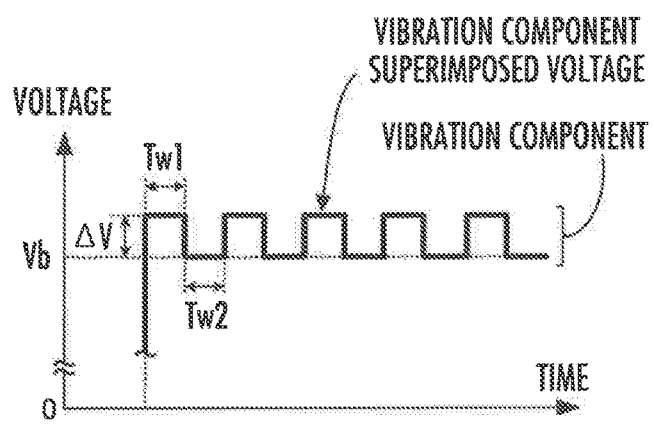
FIG. 4 is a diagram illustrating the waveform of a vibration component superimposed voltage obtained by superimposing a vibration component.

The vibration component of the vibration component superimposed voltage in the present embodiment is a square-wave voltage signal having a predetermined amplitude $\Delta V$, as illustrated in FIG. 4. FIG. 4 illustrates the time-dependent change in the voltage value of the vibration component superimposed voltage immediately after the steady desired value of the output voltage of the DC power source 10 changes to Vb in the graph.

The vibration component is a voltage signal that has an amplitude which is sufficiently small as compared with the variable width of a DC voltage applied to the elastomer 1 from the DC power source 10 (or the variable width of the steady desired value), and the mean voltage value per cycle thereof is zero or substantially zero.

More specifically, the amplitude $\Delta V$ of the square-wave vibration component is set in advance on the basis of experiments or the like such that the change in the thickness of the elastomer 1 based on a voltage change in the amplitude $\Delta V$ will be sufficiently small so as not to substantially influence the degree of stiffness of the elastomer 1.

Figure 5:
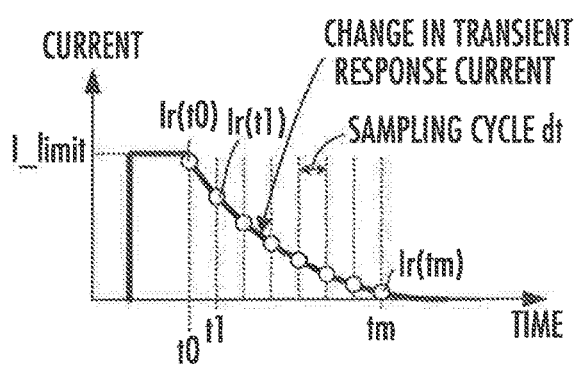
FIG. 5 is a graph illustrating the time-dependent change of an energizing current of the dielectric elastomer caused by a transient response phenomenon.

Further, a pulse width Tw1 from a rise timing (voltage increase timing) of the vibration component to a following fall timing (voltage decrease timing) thereof and a pulse width Tw2 from the fall timing to the following rise timing are set in advance by experiments or the like such that the current flowing between the elastomer 1 and the DC power source 10 (a transient response current attributable to the output voltage of the DC power source 10 changing in steps) sufficiently decreases, as illustrated in FIG. 5, within the time of each of the pulse widths. For example, it is possible to set Tw1 and Tw2 on the basis of the value of a reduction time constant calculated from the maximum value of the capacitance that can be obtained by the deformation of the elastomer 1 and the resistance value (e.g. the resistance value of the electrodes 2, 2) of a current path between the elastomer 1 and the DC power source 10, or to set Tw1 and Tw2 on the basis of the actual measurement value of the transient response current obtained when a DC voltage of a maximum step width is applied to the elastomer 1 from the DC power source 10 in a state in which the amount of relative displacement of the movable member 4 is set to a maximum. Tw1 and Tw2 may have the same time width.

Further, the cycle of the vibration component (=Tw1+ Tw2) is set to a time width that is shorter than the change cycle of the desired value of the degree of stiffness of the elastomer 1 (the change cycle of the steady desired value of the output voltage of the DC power source 10). This is because a large current flows to the elastomer 1 when the steady desired value of the DC power source 10 is changed so as to change the degree of stiffness of the elastomer 1, and the processing for estimating the capacitance of the elastomer 1 carried out by the capacitance estimating unit 22 is susceptible to, for example, the current limitation by the overcurrent prevention function of the DC power source 10.

Supplementarily, in the example illustrated in FIG. 4, the vibration component is superimposed over a steady desired value Vb such that the value of the vibration component superimposed voltage changes between the steady desired value Vb and the voltage value obtained by adding Vb and $\Delta V$ (Vb+$\Delta V$). Alternatively, however, the vibration component may be superimposed over the steady desired value Vb such that the value of the vibration component superimposed voltage changes between, for example, the steady desired value Vb and the voltage value obtained by subtracting $\Delta V$ from Vb (Vb−$\Delta V$), or changes between the voltage value obtained by subtracting ($\Delta V/2$) from Vb (Vb−($\Delta V/2$)) and the voltage value obtained by adding Vb and ($\Delta V/2$) (Vb+ ($\Delta V/2$)).

As described above, the power source control unit 21 controls the output voltage of the DC power source 10 to the vibration component superimposed voltage obtained by superimposing the vibration component over the steady desired value based on the desired value of the degree of stiffness of the elastomer 1.

In a situation wherein the processing for estimating the capacitance of the elastomer 1 is not required, it is unnecessary to superimpose the vibration component over the output voltage of the DC power source 10.

The capacitance estimating unit 22 carries out the processing for estimating the capacitance of the elastomer 1 for each period of each of the pulse widths Tw1 and Tw2 of the vibration component (at the estimation processing cycle synchronized with the vibration component) in the state wherein the vibration component superimposed voltage is being output from the DC power source 10. In this case, the capacitance estimating unit 22 carries out the processing for acquiring and storing in memory the detection value of the energizing current of the elastomer 1 indicated by the output of the current detector 11 (hereinafter referred to simply as the current detection value) during a predetermined period of the periods of the pulse width Tw1 and the pulse width Tw2 of the vibration component (hereinafter referred to as the energizing current sampling).

If the value of the vibration component superimposed voltage suddenly changes in steps due to the vibration component of the vibration component superimposed voltage output from the DC power source 10, then the transient response phenomenon causes the energizing current of the elastomer 1 to suddenly increase and then to gradually decrease at a time constant specified on the basis of the value of a capacitance C of the elastomer 1, which is the capacitance value of the current path of the energizing current, and a resistance value R of the current path (=1/(R·C)).

The energizing current becomes a current in a direction for increasing the charges stored in the elastomer 1 in the case where the magnitude of the vibration component superimposed voltage increases in steps, or becomes a current in a direction for decreasing the charges stored in the elastomer 1 in the case where the magnitude of the vibration component superimposed voltage decreases in steps.

Hereinafter, the energizing current of the elastomer 1, which exhibits the time-dependent change in a pattern in which the energizing current suddenly increases and then gradually decreases due to the transient response phenomenon attributable to the stepped change in the output voltage of the DC power source 10 as described above, will be referred to as the transient response current. Further, the period in which the current value of the transient response current gradually decreases will be referred to as the current reduction period.

FIG. 5 illustrates the time-dependent change of the transient response current. The current value of the transient response current suddenly increases immediately after the stepped change in the output voltage of the DC power source 10. Hence, the overcurrent prevention function of the DC power source 10 frequently forcibly limits the current value of the transient response current immediately after the stepped change in the output voltage of the DC power source 10 to an upper limit value I_limit. The graph of the time-dependent change of the transient response current in FIG. 5 illustrates the time-dependent change of the transient response current when the current value is limited to the upper limit value I_limit immediately after the stepped change of the output voltage of the DC power source 10 as described above. If the amount of the stepped change in the output voltage of the DC power source 10 is relatively small, then the current value of the transient response current may rise to an original peak value rather than being limited to the upper limit value I_limit.

The time constant at which the current value of the transient response current gradually decreases in the current reduction period depends on the capacitance C of the elastomer 1 and the resistance value R of the current path of the energizing current of the elastomer 1, as described above. Accordingly, the time-dependent change of the current value in the current reduction period of each of the pulse widths Tw1 and Tw2 of the vibration component has a correlation with the capacitance C.

Hence, in the energizing current sampling, the capacitance estimating unit 22 acquires, in a time series manner, the current detection values at a plurality of sampling times in the current reduction period for each of the periods of the pulse widths Tw1 and Tw2 of the vibration component.

Specifically, referring to FIG. 5, when the period of each of the pulse widths Tw1 and Tw2 of the vibration component begins, the capacitance estimating unit 22 starts to sequentially monitor the current detection value, which is indicated by the output of the current detector 11, at a predetermined sampling cycle dt. The start timing of each of the pulse widths Tw1 and Tw2 of the vibration component is given to the capacitance estimating unit 22 from the power source control unit 21. Further, the sampling cycle dt is a preset value of a time width that is sufficiently shorter than each of the pulse widths Tw1 and Tw2 of the vibration component.

When the capacitance estimating unit 22 detects the start timing of the current reduction period (time t0 in FIG. 5) by the monitoring of the current detection value, the capacitance estimating unit 22 stores and retains in a memory, in the time series manner, current detection values Ir(t0), Ir(t1), . . . , Ir(tm) at sampling times t0, t1, . . . , tm for a predetermined period (the period of m·dt) until the sampling cycle dt of a predetermined number m elapses from the sampling time (t0) at that time. Thus, the capacitance estimating unit 22 acquires the time series of a (m+1) number of current detection values Ir(t0), Ir(t1), . . . , Ir(tm) of the transient response current in the current reduction period of each of the pulse widths Tw1 and Tw2 of the vibration component.

The predetermined number m and the sampling cycle dt are desirably set to have a relationship denoted by τ_min≤m·dt≤τ_max with respect to a minimum value τ_min and a maximum value τ_max, which can be predicted as the values of the time constant of the reduction in the current value of the transient response current (i.e. desirably set such that the time width from the sampling time t0, at which the storing and retaining of the current detection value is started, to the sampling time tm, at which the storing and retaining of the current detection value is ended (=m·dt) becomes a time width within the range between τ_min and τ_max).

The graph illustrating the time-dependent change of the transient response current in FIG. 5 more specifically illustrates a transient current change in the case where the output voltage of the DC power source 10 changes in steps while the capacitance C of the elastomer 1 is being maintained to be constant.

Meanwhile, according to the present embodiment, the elastomer 1 is elastically deformed according to a change in an external force applied to the movable member 4 (i.e. an external force that causes the movable member 4 to be displaced in the direction of the central axis C with respect to the frame members 3), thus causing the capacitance C of the elastomer 1 to be also changed. Therefore, in the situation wherein the external force applied to the movable member 4 changes, the energizing current of the elastomer 1 changes as illustrated by the dashed-line graph of FIG. 6A even if the output voltage of the DC power source 10 takes a constant value that does not include the vibration component.

Figure 6A:
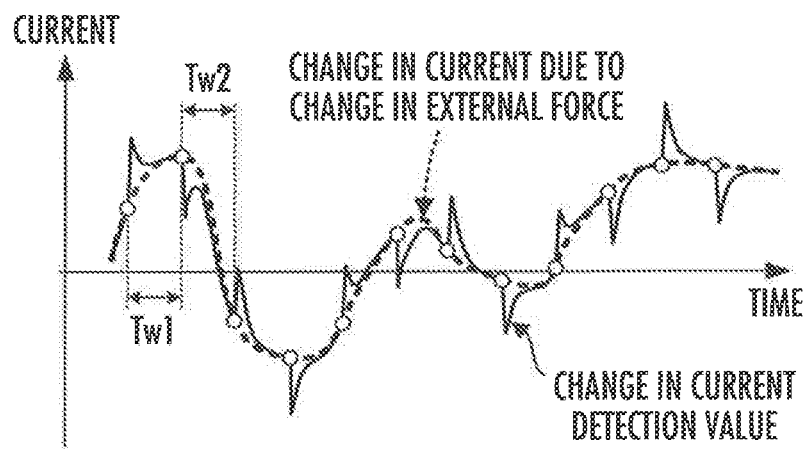
FIG. 6A and FIG. 6B are explanatory diagrams associated with the processing for correcting a detection value of an energizing current of the dielectric elastomer.

Further, if the vibration component superimposed voltage is output from the DC power source 10 in the situation wherein the external force applied to the movable member 4 changes, then the actual energizing current of the elastomer 1 in each of the pulse widths Tw1 and Tw2 of the vibration component will be, for example, a current in a form that combines a current component, which changes due to the elastic deformation of the elastomer 1 caused by a change in the external force applied to the movable member 4, and the transient response current illustrated in FIG. 5, as illustrated by the solid-line graph of FIG. 6A.

For convenience in understanding, the solid-line graph of FIG. 6A schematically illustrates the mode of the time-dependent change of the energizing current of the elastomer 1 in a situation wherein the transient response current is in a state not being limited by the overcurrent prevention function of the DC power source 10. Further, each blank dot on the solid-line graph of FIG. 6A denotes the current value at the start timing of each of the pulse widths Tw1 and Tw2 of the vibration component.

Supplementarily, if the actual energizing current of the elastomer 1 in the period of each of the pulse widths Tw1 and tw2 of the vibration component includes a current component that changes due to the elastic deformation of the elastomer 1 caused by a change in an external force applied to the movable member 4, then the current detection value indicated by the output of the current detector 11 may switch from a decreasing trend to an increasing trend after the current detection value starts to decrease in the current reduction period of the transient response current. However, in the energizing current sampling, after detecting the start timing of the current reduction period (the start timing of the gradual decrease of the current detection value), the capacitance estimating unit 22 regards that the current reduction period will continue, and stores and retains the time series of the (m+1) number of the current detection values in a memory.

In the situation wherein the elastomer 1 elastically deforms due to the change in the external force applied to the movable member 4, the actual energizing current (eventually the current detection value) of the elastomer 1 will include a current component, which is attributable to the elastic deformation of the elastomer 1 caused by a change in the external force, in addition to the transient response current, as described above. In this case, it is difficult to properly estimate the capacitance C of the elastomer 1 by directly using the current detection value in the current reduction period.

According to the present embodiment, therefore, the capacitance estimating unit 22 carries out processing for correcting each of the (m+1) number of current detection values so as to eliminate a current component that changes due to the elastic deformation of the elastomer 1 caused by a change in the external force from each of the (m+1) number of current detection values stored and retained in the memory in the time series manner in the current reduction period of each of the pulse widths Tw1 and Tw2 of the vibration component.

In this correction processing, the capacitance estimating unit 22 sequentially stores and retains, in the memory in the time series manner, the current detection values (hereinafter referred to as the first current detection values) acquired at the sampling time immediately before the start of each of the pulse widths Tw1 and Tw2 (in other words, the sampling time immediately before the end of each of the pulse widths Tw1 and Tw2) of the vibration component in the state wherein the vibration component superimposed voltage is being output from the DC power source 10. In this case, the first current detection values stored and retained in the memory are a plurality of current detection values for a predetermined period from the latest sampling time until before a predetermined time.

The time series of the first current detection values corresponds to a time series of the current detection values that include little or none of the transient response current, and therefore corresponds to the time series of the current detection values on the dashed-line graph of FIG. 6A. Thus, the time series of the first current detection values indicates a change in the energizing current of the elastomer 1 attributable to the elastic deformation of the elastomer 1 caused by a change in the external force.

Then, based on the time series of the first current detection values for the predetermined period, the capacitance estimating unit 22 identifies, by using, for example, the extrapolation method, the time-dependent change pattern of the estimated value of the energizing current of the elastomer 1 (hereinafter referred to as the predicted reference current value) in the case where it is assumed that the output voltage of the DC power source 10 in the period of the pulse width Tw1 or Tw2 that newly starts is maintained at a voltage value immediately before the start of the period of the pulse width Tw1 or Tw2 that newly starts (in the case where it is assumed that the stepped change in the output voltage of the DC power source 10 will not occur).

In this case, the time series of the first current detection values for the predetermined period is approximated by, for example, a function expression, such as a polynomial function (a cubic function or the like) having time as a variable. By the approximate functional equation, the time-dependent change pattern of the predicted reference current value in the period of the pulse width Tw1 or Tw2 (Tw2 in the illustrated example) that newly starts is estimated, as indicated by the dashed-line graph of FIG. 6B.

Further, the capacitance estimating unit 22 calculates, according to the approximate functional equation, the predicted reference current value at each sampling time during the period of the newly started pulse width Tw1 or Tw2. Subsequently, the capacitance estimating unit 22 subtracts the predicted reference current value at each sampling time in the current reduction period of the period of the newly started pulse width Tw1 or Tw2 from the current detection value at that sampling time, thereby correcting the current detection value. The current value after the correction is stored and retained in the memory in the time series manner as the current value that indicates the current value of the transient response current in the current reduction period.

Figure 6B:
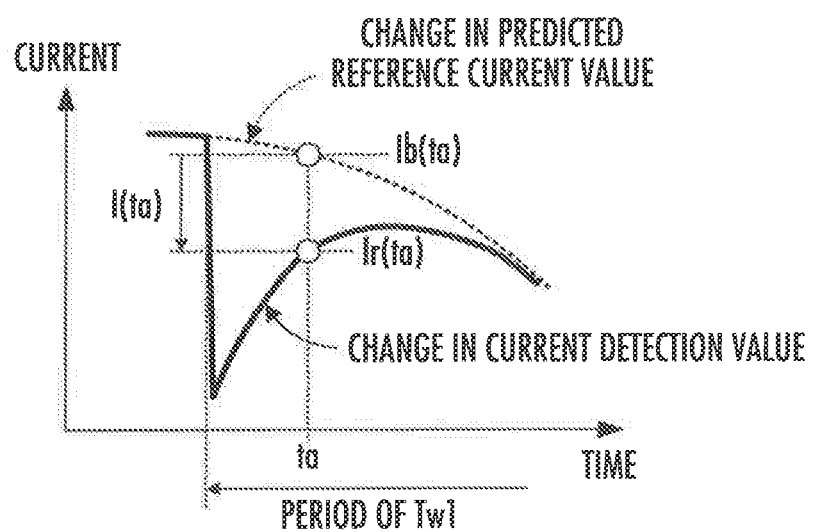

For example, as illustrated in FIG. 6B, a current value I(ta) obtained by subtracting a predicted reference current value Ib(ta) at a sampling time ta from a current detection value Ir(ta) at that time is determined as the current value of the transient response current at the sampling time ta.

As described above, the time series I(t0), I(t1), ..., I(tm) of the (m+1) number of the current values of the transient response current in the current reduction period is obtained for each period of the pulse width Tw1 or Tw2 by correcting the current detection value at each sampling time in the period of the pulse width Tw1 or Tw2 of the vibration component by the predicted reference current value.

The capacitance estimating unit 22 carries out the capacitance estimation processing for estimating the capacitance C by using the (m+1) number of the current values I(t0), I(t1), ..., I(tm), which have been acquired for each period of the pulse width Tw1 or Tw2 of the vibration component as described above (i.e. the current values obtained by correcting the current detection values at the (m+1) number of sampling times in the current reduction period by the predicted reference current values), and a model that represents the correlation between the time-dependent change in the transient response current in the current reduction period and the time-dependent change in the capacitance C of the elastomer 1.

In this case, the model is configured, for example, as described below. The time-dependent change of the current value of the transient response current in the current reduction period, especially a current value I(t) at an arbitrary time after the time t0 can be approximated by a polynomial function (the polynomial function of a degree "s"), as indicated by expression (1) given below.

$$I(t) = \theta 0 + \theta 1 \cdot (t-t0) + \theta 2 \cdot (t-t0)^2 + \ldots + \theta s \cdot (t-t0)^s \quad (1)$$

Further, the current value I(t) at an arbitrary time after the time t0 changes in an exponential manner at a time constant specified by the resistance value R of the current path between the elastomer 1 and the DC power source 10 and the capacitance C of the elastomer 1 ($=1/(R \cdot C)$). In this case, when the exponential change is approximated by the polynomial function of the degree "s", as with expression (1), the current value I(t) is denoted by expression (2) given below.

$$I(t) = \frac{(\Delta V0 - \Delta V(t0))}{R} \cdot \sum_{j=0}^{s} \frac{(-1)^j}{j! \cdot (R \cdot C)^j} \cdot (t-t0)^j \quad (2)$$

where $\Delta V0$ denotes the stepped voltage change amount of the output voltage (the vibration component superimposed voltage) of the DC power source 10 at the start timing of the pulse width Tw1 or Tw2 of the vibration component, and $\Delta V(t0)$ denotes the voltage change amount from the start timing of the pulse width Tw1 or Tw2 to the time t0. In the state wherein the transient response current is not limited by the overcurrent prevention function of the DC power source 10, the $\Delta V(t0)$ is zero ($\Delta V(t0)=0$), but in the state wherein the transient response current is forcibly limited to the upper limit value I_limit or less by the overcurrent prevention function of the DC power source 10, the $\Delta V(t0)$ is not zero ($\Delta V(t0) \neq 0$).

"j!" of each term of $\Sigma$ of the right side of expression (2) means the factorial of an integer value j (j=0, 1, ..., s).

Accordingly, coefficients $\theta 0, \theta 1, \ldots, \theta s$ of the right side of expression (1) have a relationship denoted by expression (3) given below with the capacitance C and the resistance value R.

$$\begin{bmatrix} \theta 0 \\ \theta 1 \\ \vdots \\ \theta s \end{bmatrix} = \begin{bmatrix} \frac{(\Delta V0 - \Delta V(t0))}{R} \\ \frac{(\Delta V0 - \Delta V(t0))}{R} \cdot \frac{(-1)}{R \cdot C} \\ \vdots \\ \frac{(\Delta V0 - \Delta V(t0))}{R} \cdot \frac{(-1)^s}{s! \cdot (R \cdot C)^s} \end{bmatrix} \quad (3)$$

Meanwhile, when an attention is focused on the amount of change in the current value of the transient response current in the current reduction period from the current value I(t0) at the time t0, expression (4) given below is obtained for the (m+1) number of the current values I(t0), I(t1), ..., I(tm). In expression (4), $\uparrow\Delta Im$ and $\uparrow\Delta\Theta$ denote vectors (vertical vectors) defined by expressions (4a) and (4b), respectively, and Mtm denotes a matrix defined by expression (4c) by using the sampling cycle dt of a current detection value in the current reduction period.

$$\uparrow\Delta Im = Mtm \cdot \uparrow\Theta \tag{4}$$

where $$\uparrow\Delta Im \equiv \begin{bmatrix} I(t1) - I(t0) \\ I(t2) - I(t0) \\ \vdots \\ I(tm) - I(t0) \end{bmatrix} \tag{4a}$$

$$\uparrow\Theta \equiv \begin{bmatrix} \theta 0 \\ \theta 1 \\ \vdots \\ \theta s \end{bmatrix} \tag{4b}$$

$$Mtm \equiv \begin{bmatrix} dt & dt^2 & \ldots & dt^s \\ 2 \cdot dt & (2 \cdot dt)^2 & \ldots & (2 \cdot dt)^s \\ \vdots & \vdots & \ddots & \vdots \\ m \cdot dt & (m \cdot dt)^2 & \ldots & (m \cdot dt)^s \end{bmatrix} \tag{4c}$$

Therefore, based on expression (4), expression (5) given below for calculating $\uparrow\Theta$ can be obtained from the (m+1) number of the current values I(t0), I(t1), ..., I(tm).

$$\uparrow\Theta = (Mtm)^{-1} \cdot \uparrow\Delta Im \tag{5}$$

If m=s, then $(Mtm)^{-1}$ denotes an inverse matrix in an ordinary sense, and if m>s, then $(Mtm)^{-1}$ denotes a pseudo-inverse matrix.

Further, based on expression (3) given above, the relationship between $\uparrow\Theta$ and the capacitance C and the resistance value R is denoted by expression (6) given below. $\uparrow\Delta RC$ denotes a vector (vertical vector) defined by expression (6a).

$$\uparrow\Theta = \uparrow\Delta RC \tag{6}$$

where $$\uparrow\Delta RC \equiv \begin{bmatrix} \frac{(\Delta V0 - \Delta V(t0))}{R} \cdot \frac{(-1)}{R \cdot C} \\ \frac{(\Delta V0 - \Delta V(t0))}{R} \cdot \frac{(-1)^2}{2! \cdot (R \cdot C)^2} \\ \vdots \\ \frac{(\Delta V0 - \Delta V(t0))}{R} \cdot \frac{(-1)^s}{s! \cdot (R \cdot C)^s} \end{bmatrix} \tag{6a}$$

Therefore, from expressions (5) and (6), the values of the capacitance C and the resistance value R can be determined.

Hence, according to the present embodiment, in the capacitance estimation processing for each period of the pulse width Tw1 or Tw2 of the vibration component, the capacitance estimating unit 22 estimates the capacitance C by using expressions (5) and (6) given above as the model that represents the correlation between the time-dependent change in the transient response current and the capacitance C of the elastomer 1 in the current reduction period.

More specifically, the capacitance estimating unit 22 calculates the vector $\uparrow\Theta$ having the coefficients θ1, θ2, ..., θs of the polynomial function of expression (1) as the components thereof according to expression (5) given above by using the (m+1) number of the current values I(t0), I(t1), ..., I(tm) acquired by the energizing current sampling and the correction processing during the period of the pulse width Tw1 or Tw2 of the vibration component. In this case, the value of the sampling cycle dt is a fixed value set in advance.

Then, the capacitance estimating unit 22 calculates, together with the resistance value R, the capacitance C that satisfies (or substantially satisfies) the relationship of expression (6) with respect to the calculated vector $\uparrow\Theta$. In this case, if the set value of the degree "s" of the polynomial function of expression (1) is equal to 2 (s=2), then the two expressions given by expression (6) can be used as a simultaneous equation to calculate the capacitance C and the resistance value R.

Further, if the set value of the degree "s" is greater than 2 (s>2), then the values of the capacitance C and the resistance value R can be determined by an appropriate search processing technique or the like such that the square value of a vector $(\uparrow\Theta - \uparrow\Delta RC)(=|\uparrow\Theta - \uparrow\Delta RC|^2)$ is minimized.

The value of $\Delta V0$ in expression (6) takes a value that combines the change amount of the steady desired value Vb and the amount of voltage change $\Delta V$ attributable to the vibration component in the case where the start timing of the pulse width Tw1 or Tw2 of the vibration component coincides with the change timing of the steady desired value Vb (i.e. the change timing of the degree of stiffness of the elastomer 1). Further, if the start timing of the pulse width Tw1 or Tw2 of the vibration component is a timing in the state wherein the steady desired value Vb is a fixed value, then the value of $\Delta V0$ in expression (6) coincides with the amount of voltage change $\Delta V$ attributable to the vibration component.

Further, the value of $\Delta V(t0)/R$ in expression (6) is determined, for example, as described below. Among the current detection values at sampling times after the start timing of the pulse width Tw1 or Tw2 of the vibration component, the current detection value at a sampling time immediately before the upper limit value I_limit is reached is determined as the value of $\Delta V(t0)/R$ in expression (6).

Alternatively, the applied voltage of the elastomer 1 at the sampling time immediately before the current detection value reaches the upper limit value I_limit may be detected by an appropriate voltage sensor and the voltage detection value may be determined as the value of $\Delta V(t0)$.

The resistance value R can be actually measured in advance in an experimental manner.

The processing by the capacitance estimating unit 22 is carried out as described above. By this processing, the estimated values of the capacitance C of the elastomer 1 are determined on the basis of the current values I(t0), I(t1), ..., I(tm) obtained by correcting the current detection values Ir(t0), Ir(t1), ..., Ir(tm) in the current reduction period of the transient response current for each period of the pulse width Tw1 or Tw2 of the vibration component (i.e. for each time the output voltage of the DC power source 10 changes in steps).

According to the present embodiment, the control processing unit 12 further carries out processing for estimating the amount of displacement of the movable member 4 (the amount of displacement in the direction of the central axis C) by using the capacitance C of the elastomer 1 obtained as described above.

Figure 7A:
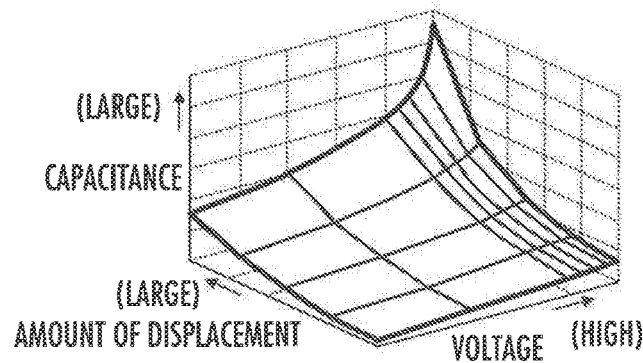
FIG. 7A is a diagram illustrating a map used to estimate the amount of displacement of a movable member of the variable stiffness mechanism illustrated in FIG. 1.

In this processing, the control processing unit 12 uses a map, which is prepared in advance to illustrate the relationship among the applied voltage of the elastomer 1, the amount of displacement of the movable member 4, and the capacitance of the elastomer 1 (the relationship in the steady state), as illustrated in FIG. 7A, thereby to determine the estimated value of the amount of displacement of the movable member 4 on the basis of the steady desired values of the output voltage (the vibration component superimposed voltage) of the DC power source 10 and the estimated value of the capacitance C.

The map illustrated in FIG. 7A is a map prepared in advance on the basis of experiments or the like. The map has been prepared such that the capacitance C of the elastomer 1 tends to increase as the applied voltage of the elastomer 1 increases or as the amount of displacement of the movable member 4 increases.

Figure 7B:
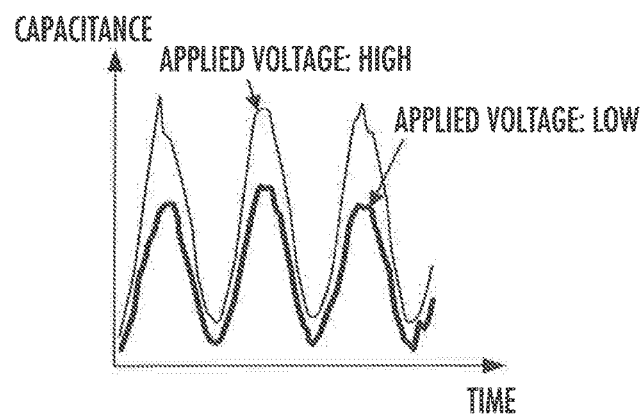
FIG. 7B is a graph illustrating the time-dependent change of an estimated value of the capacitance of the dielectric elastomer.

FIG. 7B is a graph illustrating the time-dependent change in the estimated value of the capacitance of the elastomer 1 determined by the processing carried out by the capacitance estimating unit 22 in the case where the external force applied to the movable member 4 is changed at a fixed cycle while the vibration component superimposed voltage having the steady desired value maintained constant is being output from the DC power source 10 (in the case where the amount of displacement of the movable member 4 is consequently changed at a fixed cycle).

The graph indicated by the thin line in FIG. 7B is a graph illustrating the case where the applied voltage of the elastomer 1 is relatively high (in the case where the steady desired value is relatively large), and the graph indicated by the thick line is a graph illustrating the case where the applied voltage of the elastomer 1 is relatively low (in the case where the steady desired value is relatively small).

Figure 7C:
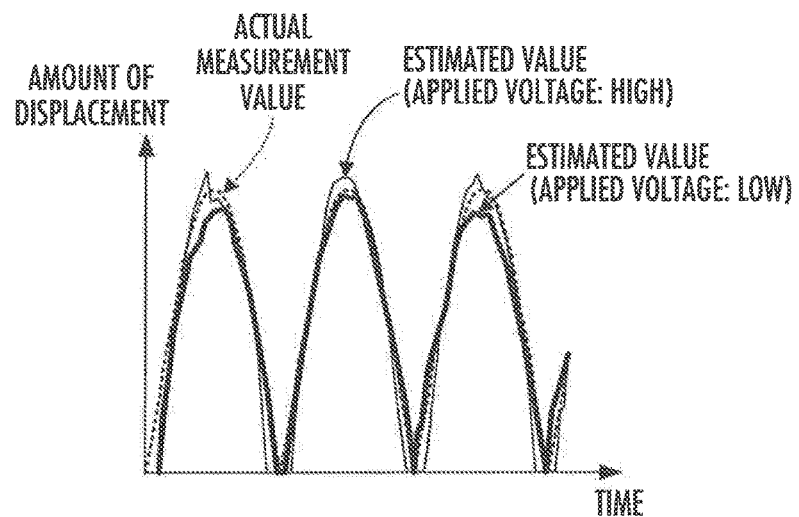
FIG. 7C is a graph illustrating the time-dependent change of an estimated value of an amount of displacement of the movable member of the variable stiffness mechanism.

Further, FIG. 7C is a graph illustrating the time-dependent change of the estimated value of the amount of displacement of the movable member 4 obtained from the map illustrated in FIG. 7A on the basis of the estimated value of the capacitance determined as illustrated in FIG. 7B and the steady desired values (two types, large and small, of the steady desired values) of the output voltage of the DC power source 10.

As with the graph of FIG. 7B, the thin-line graph of FIG. 7C is a graph illustrating the case where the applied voltage of the elastomer 1 is relatively high, and the thick-line graph is a graph illustrating the case where the applied voltage is relatively low. Further, the dashed-line graph of FIG. 7C is a graph indicating the values obtained by actually measuring the actual amount of displacement of the movable member 4 by using an appropriate displacement sensor.

As illustrated in FIG. 7C, the amount of displacement of the movable member 4 obtained by the estimation using the estimated value of the capacitance of the elastomer 1 coincides with the actual measurement value with high accuracy. This indicates that the capacitance value of the elastomer 1 can be estimated with high accuracy by the processing carried out by the capacitance estimating unit 22.

The present invention is not limited to the embodiment described above. The following will describe some modifications.

In the foregoing embodiment, the processing for estimating the capacitance of the elastomer 1 has been carried out for each period of each of the pulse widths Tw1 and Tw2 of the vibration component. Alternatively, however, it is possible to, for example, carry out the processing for estimating the capacitance of the elastomer 1 in the period of only one pulse width, i.e. either the pulse width Tw1 or Tw2. In this case, the other pulse width may be very small.

Further, in the foregoing embodiment, a square-wave signal has been used as the vibration component. Alternatively, however, the vibration component may be a voltage signal other than the square-wave signal insofar as the voltage signal is capable of triggering the transient response phenomenon, which causes a gradual reduction in a current based on the capacitance of the elastomer 1. For example, a sawtooth-shaped voltage signal, a curved voltage signal or the like may be adopted as the vibration component.

Further, in the foregoing embodiment, the description has been given of the case where the capacitance of the elastomer 1 adopted as a constituent element of the variable stiffness mechanism 100 is measured (estimated). However, it is also possible to estimate the capacitance of the elastomer 1 while the vibration component superimposed voltage, which includes the vibration component, is being applied to the elastomer 1 even in the case where, for example, the elastomer 1 is disposed such that the elastomer 1 can be elongated along the surfaces without restrictions when the thickness thereof decreases as the applied voltage increases.

Further, it is also possible to estimate the capacitance of the elastomer 1 only in the case where, for example, the steady desired value is changed in steps while the output voltage of the steady desired value (the output voltage that does not include the vibration component) is being applied to the elastomer 1 from the DC power source 10.

Further, the capacitance of the elastomer 1 may be estimated without carrying out the correction processing described above (i.e. by directly using the foregoing (m+1) number of the current detection values as they are) in the case where the external force imparted to the elastomer 1 changes less frequently or in the case where the external force changes sufficiently slowly.

DESCRIPTION OF REFERENCE NUMERALS

1 . . . Dielectric elastomer, 3 . . . Frame member (second member), 4 . . . Movable member (first member), 10 . . . DC power source (power source), 11 . . . Current detector, 21 . . . Power source control unit, 22 . . . Capacitance estimating unit

What is claimed is:
1. A capacitance measuring device for a dielectric elastomer adapted to estimate a capacitance of the dielectric elastomer, which elastically deforms according to an applied voltage, comprising: a power source which outputs a voltage applied to the dielectric elastomer such that the voltage can be variably controlled; a current detector which detects an energizing current of the dielectric elastomer; a capacitance estimating unit which estimates a-the capacitance of the dielectric elastomer by using a detection value of the energizing current detected by the current detectors a power source control unit which controls an output of the power source such that the voltage output from the power source becomes a vibration component superimposed voltage, which is a voltage obtained by superimposing the vibration component of a predetermined frequency over a steady desired value of the applied voltage of the dielectric elastomer, wherein the capacitance estimating unit is configured to carry out: energizing current sampling for acquiring, in a case where a voltage output from the power source is changed, detection values of the energizing current at a plurality of sampling times in a current reduction period, in which the energizing current of the dielectric elastomer increases and then decreases according to the change of the voltage; and capacitance estimation processing for determining an estimated value of the capacitance of the dielectric elastomer based on a model, which represents a correlation between a time-dependent change of the energizing current of the dielectric elastomer and the capacitance of the dielectric elastomer in the current reduction period, and the detection values of the energizing current at the plurality of the sampling times, and wherein the capacitance estimating unit is further configured to sequentially carry out, at a predetermined estimation processing cycle synchronized with the vibration component, the estimation of the capacitance of the dielectric elastomer by the energizing current sampling and the capacitance estimation processing in a state in which the applied voltage is being controlled to the vibration component superimposed voltage.

2. The capacitance measuring device for the dielectric elastomer according to claim 1,
wherein the vibration component is a square-wave signal.

3. The capacitance measuring device for the dielectric elastomer according to claim 1,
wherein the dielectric elastomer is provided such that an external force causing the dielectric elastomer to elastically deform can be variably applied thereto, and
the capacitance estimating unit is configured to further include a function for carrying out first processing for sequentially acquiring a first current detection value, which is a detection value of the energizing current immediately before a voltage value of the vibration component changes, in a state in which the voltage output from the power source is being controlled to the vibration component superimposed voltage, and second processing for predicting, based on a plurality of past values of the first current detection value acquired in the first processing, a time-dependent change pattern of the energizing current in the period of each estimation processing cycle, which is a time-dependent change pattern of the energizing current in a case where it is assumed that the voltage value of the vibration component in the period of the estimation processing cycle is continuously maintained at a voltage value immediately before a start of the period of the estimation processing cycle, before the period of the estimation processing cycle is started, and to correct, by the capacitance estimation processing at each estimation processing cycle, each of the detection values of the energizing current at the plurality of the sampling times during the current reduction period in the period of the estimation processing cycle by a current value at each sampling time specified by the time-dependent change pattern predicted by the second processing for the estimation processing cycle thereby to determine an estimated value of the capacitance of the dielectric elastomer based on a current value after the correction and the model.

4. The capacitance measuring device for the dielectric elastomer according to claim 1,
wherein the dielectric elastomer is a sheet-shaped elastomer and configured such that the applied voltage can be imparted in a thickness direction thereof and that the dielectric elastomer elastically deforms to increase or decrease the thickness thereof by changing the applied voltage.

5. The capacitance measuring device for the dielectric elastomer according to claim 4,
wherein the dielectric elastomer has a middle portion thereof fixed to a first member and a peripheral portion thereof fixed to a second member, the second member being relatively movable in the thickness direction of the dielectric elastomer with respect to the first member, and is provided in a tensioned state such that the dielectric elastomer is subjected to a tension between the first member and the second member in a state in which the applied voltage is not being imparted.

6. A capacitance measurement method for a dielectric elastomer for estimating a capacitance of the dielectric elastomer that is elastically deformed according to an applied voltage, comprising: a first step of controlling a voltage applied to the dielectric elastomer to a vibration component superimposed voltage, which is a voltage obtained by superimposing the vibration component of a predetermined frequency over a steady desired value of the applied voltage, thereby to periodically change the applied voltage by the vibration component; a second step of acquiring detection values of an energizing current of the dielectric elastomer at a plurality of sampling times in a current reduction period, in which the energizing current increases and then decreases according to processing of the first step; and a third step of determining an estimated value of the capacitance of the dielectric elastomer from a model, which represents a correlation between a time-dependent change of the energizing current of the dielectric elastomer and the capacitance of the dielectric elastomer in the current reduction period, and the detection values of the energizing current at the plurality of the sampling times, wherein processing in the second step and the third step is processing sequentially carried out at a predetermined estimation processing cycle synchronized with the vibration component in a state in which the applied voltage is being controlled to the vibration component superimposed voltage.

7. The capacitance measurement method for the dielectric elastomer according to claim 6,
wherein the vibration component is a square-wave signal.

8. The capacitance measurement method for the dielectric elastomer according to claim 7,
wherein the dielectric elastomer is provided such that an external force causing the dielectric elastomer to elastically deform can be variably applied thereto,
the method further includes a fourth step of sequentially acquiring a first current detection value, which is a detection value of the energizing current immediately before a voltage value of the vibration component changes, in a state in which the applied voltage is being controlled to the vibration component superimposed voltage, and a fifth step of predicting, based on a plurality of past values of the first current detection value acquired in the fourth step, a time-dependent change pattern of the energizing current in the period of each estimation processing cycle, which is a time-dependent change pattern of the energizing current in a case where it is assumed that the voltage value of the vibration component in the period of the estimation processing cycle is continuously maintained at a voltage value immediately before a start of the period of the estimation processing cycle, before the period of the estimation processing cycle is started, and the processing in the third step in each estimation processing cycle corrects each of the detection values of the energizing current at the plurality of the sampling times during the current reduction period in the period of the estimation processing cycle by using a current value at each sampling time specified by the time-dependent change pattern predicted in the fifth step for the estimation processing cycle, thereby determining an estimated value of the capacitance of the dielectric elastomer based on a current value after the correction and the model.

* * * * *